US012768892B2

(12) United States Patent
Choi

(10) Patent No.: US 12,768,892 B2
(45) **Date of Patent: *Oct. 20, 2026**

(54) APPARATUS AND METHOD FOR GENERATING BATTERY INFORMATION

(71) Applicant: LG ENERGY SOLUTION, LTD., Seoul (KR)

(72) Inventor: Soon-Hyung Choi, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 0 days.

This patent is subject to a terminal disclaimer.

(21) Appl. No.: 19/036,925

(22) Filed: Jan. 24, 2025

(65) Prior Publication Data

US 2025/0258235 A1 Aug. 14, 2025

(30) Foreign Application Priority Data

Jan. 26, 2024 (KR) ........................ 10-2024-0012348

(51) Int. Cl.

*G01R 31/367* (2019.01)
*G01R 31/36* (2020.01)
*G01R 31/382* (2019.01)
*G01R 31/3842* (2019.01)
*G01R 31/387* (2019.01)
*G01R 31/392* (2019.01)

(52) U.S. Cl.

CPC ......... *G01R 31/367* (2019.01); *G01R 31/382* (2019.01); *G01R 31/387* (2019.01); *G01R 31/392* (2019.01); *G01R 31/3648* (2013.01); *G01R 31/3842* (2019.01)

(58) Field of Classification Search

CPC .. G01R 31/367; G01R 31/382; G01R 31/387; G01R 31/392; G01R 31/3648; G01R 31/3842

See application file for complete search history.

(56) References Cited

U.S. PATENT DOCUMENTS

2017/0261560 A1* 9/2017 Goto .................. G01R 31/3648
2018/0145531 A1 5/2018 Jung et al.
2018/0203071 A1* 7/2018 Takemura ............. H01M 10/48
2021/0167620 A1 6/2021 Yazami et al.
2021/0190878 A1 6/2021 Lee et al.
2021/0199723 A1* 7/2021 Kim ..................... G01R 31/392
2023/0039356 A1 2/2023 Jee et al.
2023/0119100 A1 4/2023 Choi et al.

(Continued)

FOREIGN PATENT DOCUMENTS

JP 5832380 B2 * 12/2015
JP 2021-197832 A 12/2021

(Continued)

*Primary Examiner* — John C Kuan

(74) *Attorney, Agent, or Firm* — Bryan Cave Leighton Paisner LLP

(57) ABSTRACT

A battery information generating apparatus according to an embodiment of the present disclosure includes: a profile acquisition unit that acquires a differential profile representing a correspondence between a capacity and a differential voltage of a battery; and a control unit that determines a target C-rate (current rate) corresponding to the differential profile, and correct the differential profile based on an overvoltage profile corresponding to the target C-rate, thereby generating a corrected profile.

11 Claims, 10 Drawing Sheets

(56) References Cited

U.S. PATENT DOCUMENTS

| | | | | |
|---|---|---|---|---|
| 2023/0140094 | A1 | 5/2023 | Cha et al. | |
| 2023/0160970 | A1 | 5/2023 | Choi et al. | |
| 2023/0160971 | A1 | 5/2023 | Cha et al. | |
| 2023/0176128 | A1 | 6/2023 | Bae et al. | |
| 2023/0207910 | A1 | 6/2023 | Yoon et al. | |
| 2024/0274902 | A1 | 8/2024 | Yoon et al. | |
| 2024/0402259 | A1 | 12/2024 | Choi et al. | |
| 2025/0158437 | A1* | 5/2025 | Campbell | G01R 31/388 |

FOREIGN PATENT DOCUMENTS

| | | | | |
|---|---|---|---|---|
| JP | 2023-519692 | A | 5/2023 | |
| KR | 20160026766 | A * | 3/2016 | H01M 10/482 |
| KR | 10-2018-0056238 | A | 5/2018 | |
| KR | 10-2022-0009918 | A | 1/2022 | |
| KR | 10-2351637 | B1 | 1/2022 | |
| KR | 10-2022-0015998 | A | 2/2022 | |
| KR | 10-2022-0021730 | A | 2/2022 | |
| KR | 10-2022-0065604 | A | 5/2022 | |
| KR | 10-2022-0067328 | A | 5/2022 | |
| KR | 10-2022-0094042 | A | 7/2022 | |
| KR | 10-2023-0112482 | A | 7/2023 | |
| WO | WO-2024048033 | A1 * | 3/2024 | G01R 31/382 |

* cited by examiner

APPARATUS AND METHOD FOR GENERATING BATTERY INFORMATION

CROSS-REFERENCE TO RELATED APPLICATIONS

This application is based on and claims priority from Korean Patent Application No. 10-2024-0012348, filed on Jan. 26, 2024, with the Korean Intellectual Property Office, the disclosure of which is incorporated herein in its entirety by reference.

TECHNICAL FIELD

The present disclosure relates to a battery information generating apparatus and method, more particularly, a battery information generating apparatus and method for efficiently generating information related to a battery.

BACKGROUND

Recently, with the rapidly increasing demand for portable electronic products such as notebook computers, video cameras, and portable telephones, and the accelerating development of electric vehicles, energy storage batteries, robots, and satellites, researches on the high-performance batteries allowing repeated charging and discharging are actively underway.

Currently, commercially available batteries include, for example, nickel-cadmium batteries, nickel-hydrogen batteries, nickel-zinc batteries, and lithium batteries. Of these batteries, lithium batteries are gaining considerable attention due to their advantages including a substantially low memory effect to allow a high degree of freedom in charging and discharging, a very low self-discharging rate, and high energy density, as compared to nickel-based batteries.

While many studies are being conducted on the batteries focusing on the high-capacity and the high-density, it is also important to improve the lifespan and the safety of the batteries. In order to enhance the safety of batteries, a technology is necessary, which may accurately diagnose the current state of batteries.

In the related art, the state of a battery has been diagnosed by analyzing a battery profile representing a correspondence between the capacity and the voltage of the battery. For example, the capacity and the voltage are measured during a charging process of the battery, and the state of the battery is diagnosed by analyzing the battery profile representing the correspondence between the measured capacity and voltage. In another example, the state of the battery may be diagnosed based on the capacity and the voltage measured during a discharging process of the battery.

In order to more accurately diagnose the current state of the battery, a battery profile accurately reflecting the current state of the battery is needed. However, there is a problem of requiring the low-rate charging and discharging at, for example, 0.05 C (C-rate) in order to acquire the battery profile. That is, since the related art requires the low-rate charging and discharging to diagnose the state of the battery, there is a limitation in diagnosing the state of the battery.

For example, when the battery is charged and discharged at a C-rate of 0.33 C or greater, an acquired battery profile includes an overvoltage, and therefore, the battery profile may not accurately reflect the current state of the battery due to the influence of the overvoltage. When the battery profile including the overvoltage is used, there is the problem that the state of the battery may not be accurately diagnosed, which requires the low-rate charging and discharging to accurately diagnose the state of the battery.

SUMMARY

An embodiment of the present disclosure provides a battery information generating apparatus and method for quickly generating a profile used for diagnosing the state of a battery.

Various aspects of the present disclosure may be understood from the descriptions herein below, and may be more clearly understood from embodiments of the present disclosure. Further, it is readily apparent that various aspects of the present disclosure may be implemented by elements described in the claims and combinations thereof.

A battery information generating apparatus according to an aspect of the present disclosure may include: a profile acquisition unit that acquires a differential profile representing a correspondence between a capacity and a differential voltage of a battery: and a control unit that determines a target C-rate (current rate) corresponding to the differential profile, and correct the differential profile based on an overvoltage profile corresponding to the target C-rate, thereby generating a corrected profile.

The control unit may be configured to calculate a difference between the differential profile and the overvoltage profile to generate the correction profile.

The overvoltage profile is pre-stored for each of a plurality of C-rates.

The control unit may be configured to select the overvoltage profile corresponding to the target C-rate from a plurality of pre-stored overvoltage profiles.

The overvoltage profile may be preset based on a reference differential profile of a reference battery for a reference C-rate and a target differential profile of the reference battery for the target C-rate.

The overvoltage profile may be preset to represent a difference between the reference differential profile and the target differential profile.

The target C-rate may be set to be greater than the reference C-rate.

The control unit may be configured to output the corrected profile to an outside, to provide information about the battery.

A battery pack according to another aspect of the present disclosure may include the battery information generating apparatus according to an aspect of the present disclosure.

A vehicle according to yet another aspect of the present disclosure may include the battery information generating apparatus according to an aspect of the present disclosure.

A battery information generating method according to still yet another aspect of the present disclosure may include: a profile acquisition step of acquiring a differential profile representing a correspondence between a capacity and a differential voltage of a battery: a target determination step of determining a target C-rate corresponding to the differential profile: and a corrected profile generation step of correcting the differential profile based on an overvoltage profile corresponding to the target C-rate to generate a corrected profile.

A non-transitory computer-readable storage medium according to still yet another aspect of the present disclosure may have therein a program for performing a battery information generating method including: a profile acquisition step of acquiring a differential profile representing a correspondence between a capacity and a differential voltage of a battery: a target determination step of determining a target C-rate corresponding to the differential profile: and a corrected profile generation step of correcting the differential profile based on an overvoltage profile corresponding to the target C-rate to generate a corrected profile.

According to an aspect of the present disclosure, the battery information generating apparatus may relatively quickly generate a corrected profile useful for diagnosing the state of the battery, so that the total time required to diagnose the state of the battery may be reduced.

The effects of the present disclosure are not limited to those described above, and other effects that are not described herein may clearly be understood to those skilled in the art from the descriptions in the claims.

BRIEF DESCRIPTION OF THE DRAWINGS

Since the drawings attached herewith serve to facilitate the understanding of the technical idea of the present disclosure in conjunction with the detailed description of the invention herein below, the present disclosure should not be construed as being limited to the matters illustrated in the drawings.

DETAILED DESCRIPTION

Figure 1:
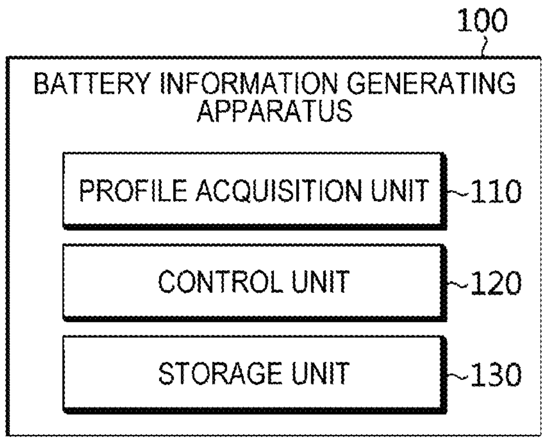
FIG. 1 is a view schematically illustrating a battery information generating apparatus according to an embodiment of the present disclosure.

Words and terms used in the detailed description and the claims herein should not be interpreted to be limited to their usual or dictionary meanings, but should be interpreted to have meanings and concepts that correspond to the technical idea of the present disclosure in compliance with the principle that inventors may appropriately define terms and concepts for the purpose of best describing the present disclosure.

Accordingly, it can be appreciated that the embodiments described herein and the configurations illustrated in the drawings are merely examples of the present disclosure, which do not exhaustively represent the technical idea of the present disclosure, and various equivalents and modifications may be made to substitute the present disclosure at the time of filing the present disclosure.

When describing the present disclosure, detailed description of related known configurations or functions may be omitted if determined to obscure the gist of the present disclosure.

Terms with ordinal numbers such as first, second and so on may be used to discriminate one of various components from the other, but should not be interpreted as limiting the components.

Throughout the descriptions herein, when a certain part "includes" a specific component, this description does not indicate that the certain part excludes other components, but indicates that the certain part may further include other components, unless otherwise defined.

Further, throughout the descriptions herein, when two components are "connected" to each other, this description indicates not only that the two components are "directly connected" to each other, but also that the two components are "indirectly connected" to each other via another component.

FIG. 1 is a view schematically illustrating a battery information generating apparatus 100 according to an embodiment of the present disclosure.

Referring to FIG. 1, the battery information generating apparatus 100 may include a profile acquisition unit 110, a control unit 120, and a storage unit 130.

A battery may indicate a single isolated cell that is physically separable and has a negative electrode terminal and a positive electrode terminal. For example, a lithium-ion battery or a lithium polymer battery may be considered as the battery. The type of battery may be a cylindrical type, a prismatic type, or a pouch type. Further, the battery may indicate a battery bank, a battery module, or a battery pack, in which a plurality of cells is connected to each other in series and/or in parallel. Herein below, for the convenience of description, it is assumed that the battery indicates a single isolated cell.

The profile acquisition unit 110 may be configured to acquire a differential profile representing a correspondence between the capacity and the differential voltage of a battery.

For example, a battery profile BP represents a correspondence between the voltage (V) and the capacity (Q) of a battery when the battery is charged from a preset charging start SOC or 0% to a preset charging termination SOC or 100%. In another example, the battery profile BP may represent a correspondence between the voltage (V) and the capacity (Q) of a battery when the battery is discharged from a preset discharging start SOC or 100% to a preset discharging termination SOC or 0%.

Figure 2:
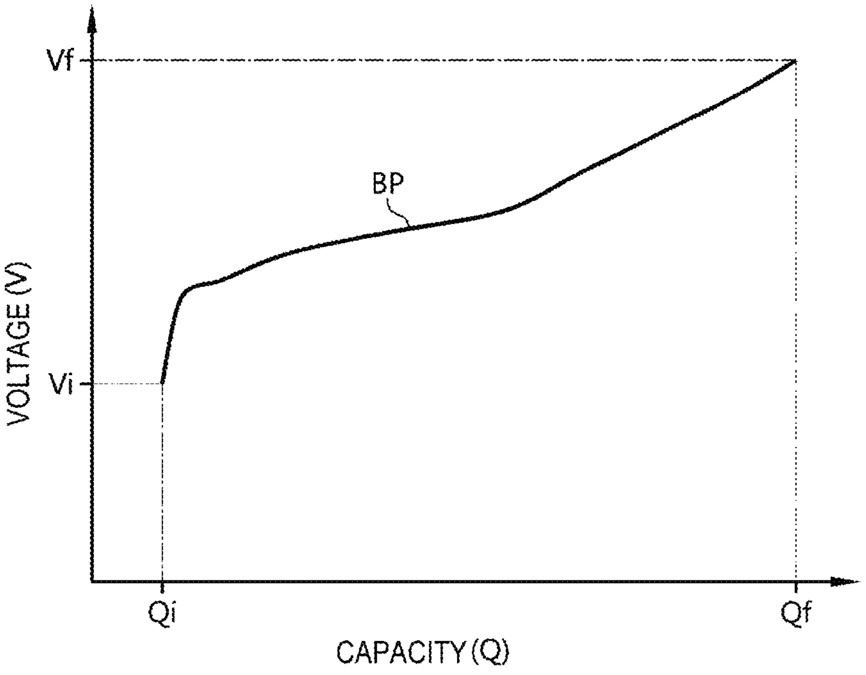
FIG. 2 is a view schematically illustrating a battery profile according to an embodiment of the present disclosure.

FIG. 2 is a view schematically illustrating the battery profile BP according to an embodiment of the present disclosure. The battery profile BP may be represented as an X-Y graph in which the X axis is set as the capacity (Q), and the Y axis is set as the voltage (V). The voltage range of the battery is Vi to Vf, and the capacity range of the battery is Qi to Qf.

Then, when the battery profile BP is differentiated with respect to the capacity, a differential profile may be generated, which represents a correspondence between the differential voltage (dV/dQ) and the capacity (Q). The differential voltage is a differential value of the voltage with respect to the capacity, and is obtained by differentiating the voltage with respect to the capacity. Hereinafter, the differential profile obtained by differentiating the voltage with respect to the capacity will be referred to as a first differential profile DP1.

Figure 3:
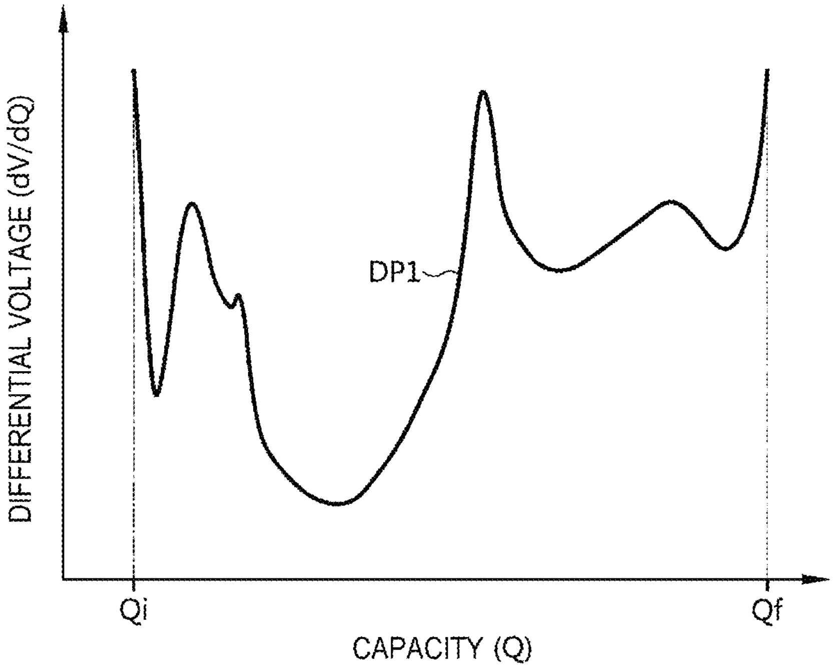
FIG. 3 is a view schematically illustrating a first differential profile according to an embodiment of the present disclosure.

FIG. 3 is a view schematically illustrating the first differential profile DPI according to an embodiment of the present disclosure. The first differential profile DPI may be represented as an X-Y graph in which the X axis is set as the capacity (Q), and the Y axis is set as the differential voltage (dV/dQ).

Then, when the battery profile BP is differentiated with respect to the voltage, a differential profile may be generated, which represents a correspondence between the differential capacity (dQ/dV) and the voltage (V). Here, the differential capacity is a differential value of the capacity with respect to the voltage, and is obtained by differentiating the capacity with respect to the voltage. Hereinafter, the differential profile obtained by differentiating the capacity with respect to the voltage will be referred to as a second differential profile DP2.

Figure 4:
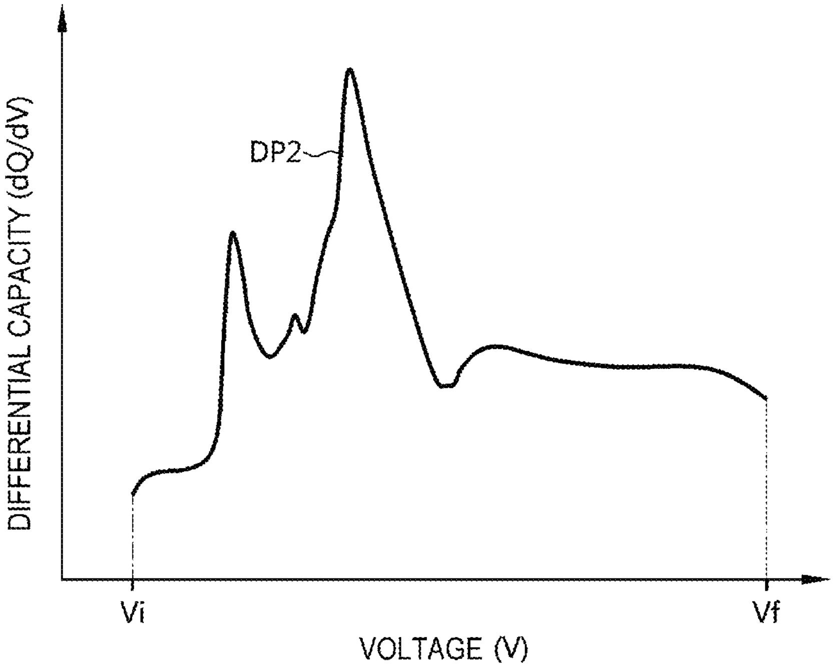
FIG. 4 is a view schematically illustrating a second differential profile according to an embodiment of the present disclosure.

FIG. 4 is a view schematically illustrating the second differential profile DP2 according to an embodiment of the present disclosure. The second differential profile DP2 may be represented as an X-Y graph in which the X axis is set as the voltage (V), and the Y axis is set as the differential capacity (dQ/dV).

For example, the C-rate (current-rate) of the charging or discharging for generating the battery profile BP is not particularly limited. In order to acquire more accurate battery profile BP and differential profile, the battery may be charged or discharged at a low rate. For example, the battery profile BP may be generated during the process of charging or discharging the battery at a low rate such as 0.05 C.

For example, the profile acquisition unit 110 may directly receive the differential profile of the battery from the outside. For example, the profile acquisition unit 110 may acquire the differential profile by being connected to the outside via a wired and/or wireless network to receive the differential profile.

In another example, the profile acquisition unit 110 may directly receive the battery profile BP of the battery from the outside. Then, the profile acquisition unit 110 may generate the differential profile based on the received battery profile BP. For example, the profile acquisition unit 110 may be connected to the outside via a wired and/or wireless network to receive the battery profile BP, and directly generate the differential profile from the received battery profile BP, to acquire the differential profile.

In yet another example, the profile acquisition unit 110 may receive battery information about the voltage and the capacity of the battery. Then, the profile acquisition unit 110 may generate the battery profile BP based on the received battery information, and may generate the differential profile based on the generated battery profile BP. The profile acquisition unit 110 may acquire the differential profile by directly generating the differential profile based on the received battery information.

The profile acquisition unit 110 may be connected to the control unit 120 for a communication. For example, the profile acquisition unit 110 may be connected to the control unit 120 in the wired or wireless manner. The profile acquisition unit 110 may transmit the acquired differential profile to the control unit 120.

The control unit 120 may be configured to determine a target C-rate corresponding to the differential profile.

Further, the control unit 120 may acquire the differential profile and information about the corresponding target C-rate together from the profile acquisition unit 110.

For example, when the battery is charged at 0.33 C, the target C-rate corresponding to the differential profile may be 0.33 C. The control unit 120 may receive the differential profile and information about 0.33 C from the profile acquisition unit 110. Then, the control unit 120 may determine 0.33 C corresponding to the differential profile to be the target C-rate.

The control unit 120 may be configured to correct the differential profile based on an overvoltage profile OP corresponding to the target C-rate, and generate a corrected profile CP.

The overvoltage profile OP may be preset to represent an overvoltage portion included in the differential profile. For example, the overvoltage profile OP may be preset based on a reference differential profile of a reference battery for a reference C-rate and a target differential profile of the reference battery for the target C-rate. The target C-rate may be set to be greater than the reference C-rate. According to an embodiment, the overvoltage profile OP may be preset to represent a difference between the reference differential profile and the target differential profile.

For example, it is assumed that the reference C-rate is 0.05 C, and the target C-rate is 0.33 C. When the reference battery is charged (or discharged) at 0.05 C, a reference battery profile for the reference C-rate may be acquired, and the reference differential profile may be acquired based on the reference battery profile. Then, when the reference battery is charged (or discharged) at 0.33 C, a target battery profile for the target C-rate may be acquired, and the target differential profile may be acquired based on the target battery profile. Then, an overvoltage profile OP corresponding to the C-rate of 0.33 C may be generated according to the difference between the reference differential profile and the target differential profile. When the battery is charged or discharged at the target C-rate greater than the reference C-rate, the measured voltage of the voltage may include an overvoltage. Thus, the control unit 120 may remove the reference differential profile based on the reference C-rate from the target differential profile based on the target C-rate, to generate the overvoltage profile OP.

Figure 5:
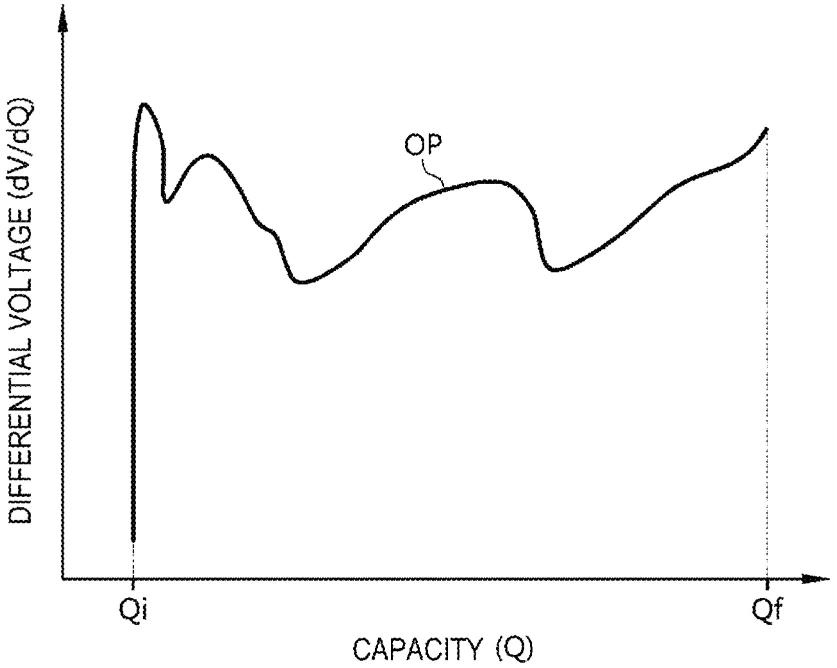
FIG. 5 is a view schematically illustrating an overvoltage profile according to an embodiment of the present disclosure.

FIG. 5 is a view schematically illustrating the overvoltage profile OP according to an embodiment of the present disclosure. FIG. 5 represents the overvoltage profile OP corresponding to the first differential profile DP1.

In the embodiment of FIG. 5, the overvoltage profile OP may be represented as an X-Y graph in which the X axis is set as the capacity, and the Y axis is set as the differential voltage. When the differential profile acquired by the profile acquisition unit 110 is the first differential profile DP1, the overvoltage profile OP may represent the correspondence between the capacity and the differential voltage.

The overvoltage profile OP corresponding to the second differential profile DP2 may be represented as an X-Y graph in which the X axis is set as the voltage, and the Y axis is set as the differential capacity. When the differential profile acquired by the profile acquisition unit 110 is the second differential profile DP2, the overvoltage profile OP may represent the correspondence between the voltage and the differential capacity.

Then, the control unit 120 may be configured to select an overvoltage profile corresponding to the target C-rate from a plurality of pre-stored overvoltage profiles OP.

The overvoltage profile OP may be pre-stored for each of a plurality of C-rates.

A plurality of overvoltage profiles OP may be provided, and C-rates corresponding to the plurality of overvoltage profiles OP, respectively, may be different from each other. For example, based on unit C-rates, overvoltage profiles OP corresponding to the C-rates, respectively, may be stored in advance.

Further, an overvoltage profile OP for a C-rate that is not acquired experimentally may be acquired and stored by an interpolation or extrapolation between similar overvoltage profiles OP. For example, the control unit 120 may generate overvoltage profiles OP for various C-rates through the interpolation or extrapolation, in addition to the pre-stored overvoltage profiles OP, and store the generated overvoltage profiles OP in the storage unit 130. For example, when an overvoltage profile OP corresponding to the C-rate of 1 C and an overvoltage profile OP corresponding to the C-rate of 1.2 C are stored in advance, an overvoltage profile OP corresponding to the C-rate of 1.1 C may be further acquired based on the difference between the two overvoltage profiles OP.

The control unit 120 may be configured to calculate the difference between the differential profile and the overvoltage profile OP to generate the corrected profile CP.

For example, the control unit 120 may generate the corrected profile CP by calculating the difference between the differential profile and the overvoltage profile OP in the same way that the overvoltage profile OP is generated according to the difference between the reference differential profile and the target differential profile.

For example, when the differential profile is the first differential profile DPI, the control unit 120 may calculate a differential voltage difference for each capacity between the first differential profile DPI and the overvoltage profile OP to generate the corrected profile CP.

In another embodiment, when the differential profile is the second differential profile DP2, the control unit 120 may calculate a differential capacity difference for each voltage between the second differential profile DP2 and the overvoltage profile OP to generate the corrected profile CP.

Figure 6:
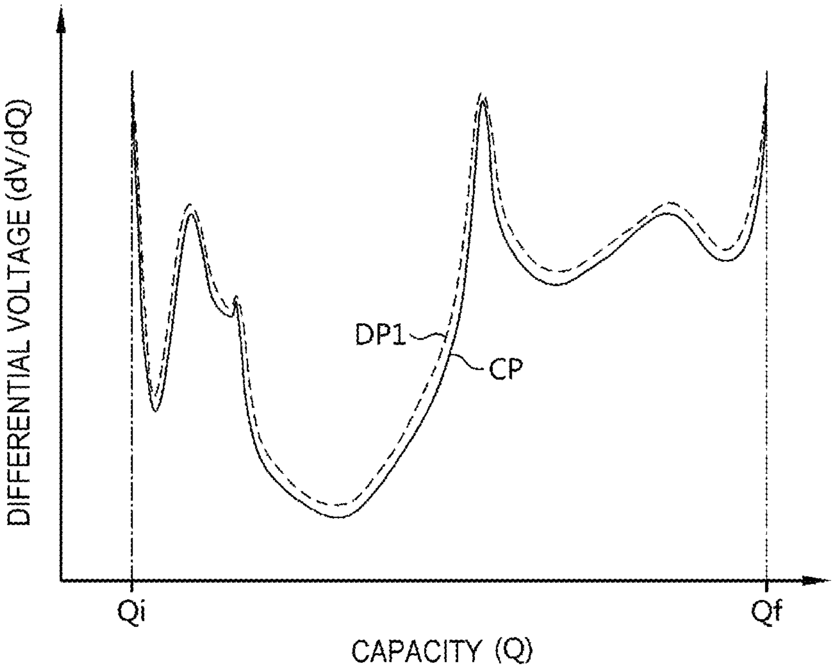
FIG. 6 is a view schematically illustrating a corrected profile according to an embodiment of the present disclosure.
Figure 7:
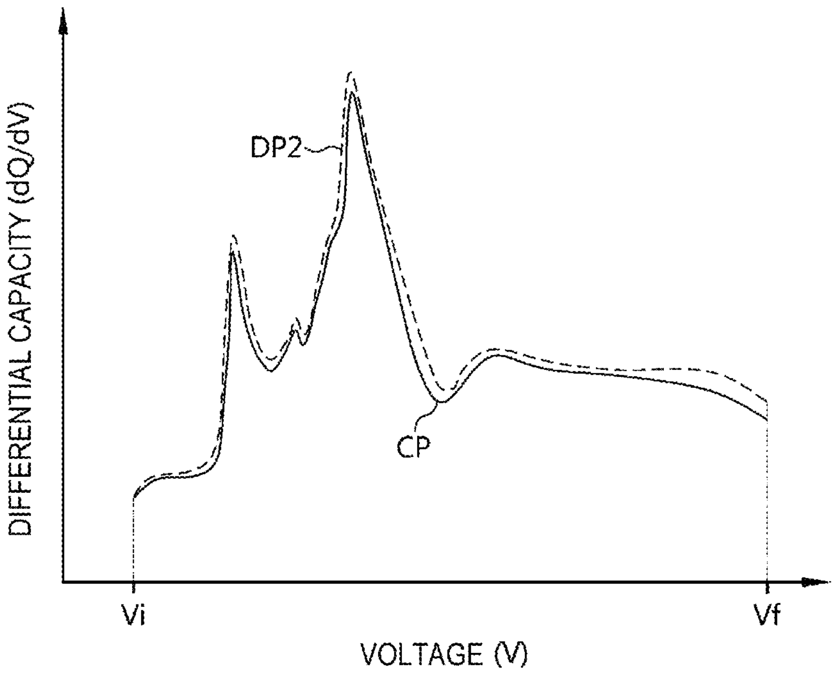
FIG. 7 is a view schematically illustrating a corrected profile according to an embodiment of the present disclosure.

FIGS. 6 and 7 are views schematically illustrating the corrected profile CP according to an embodiment of the present disclosure.

FIG. 6 is a view illustrating the corrected profile CP corresponding to the first differential profile DP1. In the embodiments of FIGS. 5 and 6, the corrected profile CP may be generated according to the differential voltage difference for each capacity between the first differential profile DPI and the corresponding overvoltage profile OP. The control unit 120 may calculate the difference between the first differential profile DP1 and the overvoltage profile OP, to generate the corrected profile CP in which the overvoltage portion included in the first differential profile DPI is removed.

FIG. 7 is a view illustrating the corrected profile CP corresponding to the second differential profile DP2. In the embodiment of FIG. 7, the corrected profile CP may be generated according to the differential capacity difference for each voltage between the second differential profile DP2 and the corresponding overvoltage profile (not illustrated). The control unit 120 may calculate the difference between the second differential profile DP2 and the overvoltage profile OP, to generate the corrected profile CP in which the overvoltage portion included in the second differential profile DP2 is removed.

According to an embodiment of the present disclosure, it is not enforced to charge and discharge the battery at the low C-rate (e.g., 0.05 C) for the purpose of acquiring an accurate differential profile, so that the corrected profile CP in which the overvoltage is removed may be acquired quickly. Further, since the corrected profile CP is used to diagnose the state of the battery, the battery information generating apparatus 100 has the advantage of quickly generating a profile useful for diagnosing the battery For example, when the low-rate charging and discharging at 0.05 C are enforced to acquire the battery profile BP, it may take about 20 hours merely to acquire the battery profile BP. Further, additional time may be required to perform a process of converting the acquired battery profile BP into the differential profile and diagnosing the state of the battery based on the differential profile. When the charging and discharging are performed at the low C-rate (e.g., 0.05 C) as described above, significant time is required to perform the process of acquiring the battery profile BP, which makes it difficult to quickly diagnose the state of the battery.

When the battery is charged and discharged at the C-rate of 0.33 C as in an embodiment of the present disclosure, the battery profile BP may be acquired in about 3 hours. According to an embodiment of the present disclosure, the time required to acquire the battery profile BP may be reduced, as compared to when the charging and discharging are performed at the low C-rate such as 0.05 C.

The battery profile BP acquired according to an embodiment of the present disclosure includes an overvoltage that corresponds to noise. By calculating a difference between the differential profile and the overvoltage profile OP, the battery information generating apparatus 100 may quickly remove noise included in the differential profile. Thus, even further taking into account the time required during the process of generating the corrected profile CP, the battery information generating apparatus 100 according to an embodiment of the present disclosure has the advantage of diagnosing the state of the battery relatively very quickly, as compared to the method that enforces the low-rate charging and discharging.

The profile acquisition unit 110 and the control unit 120 provided in the battery information generating apparatus 100 may selectively include, for example, a processor, an application-specific integrated circuit (ASIC), other chipsets, logic circuits, registers, a communication modem, and a data processing apparatus, which are well-known in the art, in order to execute various control logics performed in the present disclosure. When the control logics are implemented by software, the control unit 120 may be implemented as a set of program modules. In this case, the program modules may be stored in a memory, and executed by the profile acquisition unit 110 and/or the control unit 120. The memory may be provided inside or outside the profile acquisition unit 110 and/or the control unit 120, and may be connected to the profile acquisition unit 110 and/or the control unit 120 by various well-known means.

The battery information generating apparatus 100 may further include the storage unit 130. The storage unit 130 may store, for example, data or programs necessary when each component of the battery information generating apparatus 100 performs the operation and function thereof, or data generated when the operation and function are performed. The storage unit 130 is not particularly limited in type as long as it is a well-known information storage means capable of recording, erasing, updating, and reading data. The information storage means may include, for example, a random access memory (RAM), a flash memory, a read-only memory (ROM), an electronically erasable programmable read-only memory (EEPROM), and a register. Further, the storage unit 130 may store program codes, in which processes executable by the profile acquisition unit 110 and/or the control unit 120 are defined. Further, the storage unit 130 may store the battery profile BP, the differential profiles DP1 and DP2, the overvoltage profile OP, and the corrected profile CP.

In an embodiment, the profile acquisition unit 110 may be configured to acquire the first differential profile DP1 representing the correspondence between the capacity and the differential voltage. The control unit 120 may be configured to correct the first differential profile DP1 based on the first overvoltage profile OP representing the correspondence between the capacity and the differential voltage.

In another embodiment, the profile acquisition unit 110 may be configured to acquire the second differential profile DP2 representing the correspondence between the voltage and the differential capacity. The control unit 120 may be configured to correct the second differential profile DP2 based on the second overvoltage profile OP representing the correspondence between the voltage and the differential capacity.

Since the difference between the differential profile and the overvoltage profile OP should be calculated in order to generate the corrected profile CP, the differential profile and the overvoltage profile OP may have the same format.

When the differential profile represents the correspondence between the capacity and the differential voltage, the overvoltage profile OP may also represent the correspondence between the capacity and the differential voltage. When the differential profile represents the correspondence between the voltage and the differential capacity, the overvoltage profile OP may also represent the correspondence between the voltage and the differential capacity.

For example, referring to FIGS. 3, 5, and 6, the first differential profile DPI and the overvoltage profile OP represent the correspondence between the capacity and the differential voltage. Thus, the control unit 120 may calculate the differential voltage difference for each capacity between the first differential profile DPI and the overvoltage profile OP, to generate the corrected profile CP.

The control unit 120 may be configured to output the corrected profile CP to the outside to provide information about the battery.

The control unit 120 may be connected to an external device capable of diagnosing the state of the battery based on the corrected profile CP, for a communication via a wired or wireless network. The control unit 120 may transmit the corrected profile CP to the external device through a wired and/or wireless communication. For example, the external device is not particularly limited as long as it is a device including a diagnosing device or server and capable of analyzing the corrected profile CP to diagnose the state of the battery.

Since the corrected profile CP represents the current state of the battery, the state of the battery may be diagnosed based on the behavior of peaks included in the corrected profile CP. Each peak indicates a maximum point or a minimum point in the corrected profile CP. When the state of the battery is diagnosed based on a differential profile including an overvoltage, the state of the battery may not be accurately diagnosed due to the influence of the overvoltage. Since the battery information generating apparatus 100 generates the corrected profile CP in which the overvoltage included in the differential profile is removed, the state of the battery may be diagnosed relatively accurately based on the corrected profile CP. The battery information generating apparatus 100 may quickly generate the corrected profile CP used to diagnose the state of the battery, so that the total time required to diagnose the state of the battery may be reduced.

The battery information generating apparatus 100 according to the present disclosure may be applied to a battery management system (BMS). For example, a BMS according to the present disclosure may include the battery information generating apparatus 100 described above. In this configuration, at least a portion of the respective components of the battery information generating apparatus 100 may be implemented by complementing or adding functions of components included in well-known BMSs. For example, the profile acquisition unit 110, the control unit 120, and the storage unit 130 of the battery information generating apparatus 100 may be implemented as components of the BMS.

Further, the battery information generating apparatus 100 according to the present disclosure may be provided in a battery pack. The battery pack according to the present disclosure may include the battery information generating apparatus 100 described above and one or more battery cells. Further, the battery pack may include, for example, electronic components (e.g., relays and fuses) and a case.

Figure 8:
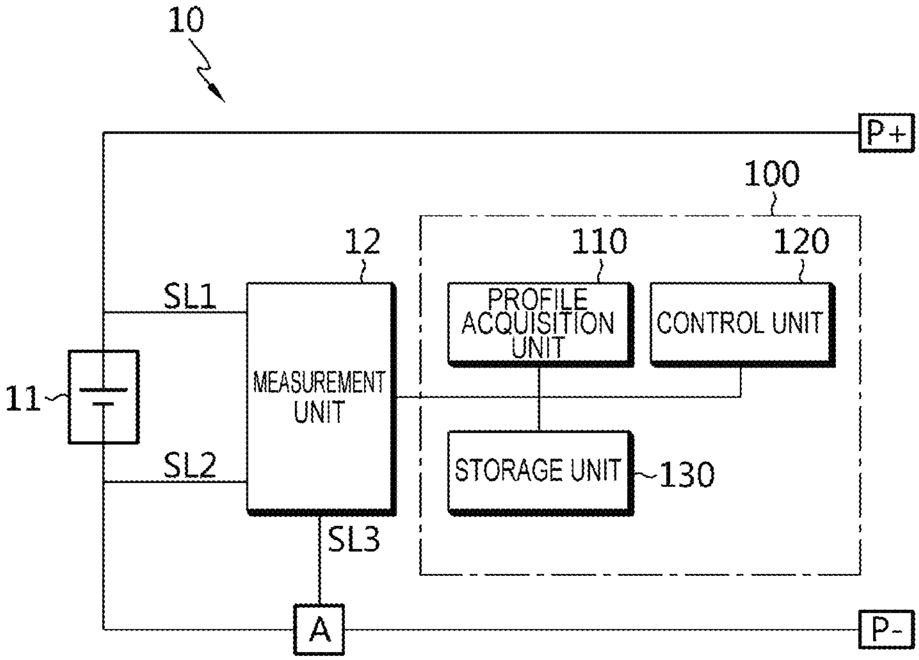
FIG. 8 is a view schematically illustrating a battery pack according to another embodiment of the present disclosure.

FIG. 8 is a view schematically illustrating a battery pack 10 according to another embodiment of the present disclosure.

The positive terminal of the battery 11 may be connected to the positive terminal P+ of the battery pack 10, and the negative terminal of the battery 11 may be connected to the negative terminal P− of the battery pack 10.

The measurement unit 12 may be connected to a first sensing line SL1, a second sensing line SL2, and a third sensing line SL3. The measurement unit 12 may be connected to the positive terminal of the battery 11 via the first sensing line SL1, and may be connected to the negative terminal of the battery 11 via the second sensing line SL2. The measurement unit 12 may measure the voltage of the battery 11 based on the voltage measured in each of the first sensing line SL1 and the second sensing line SL2.

The measurement unit 12 may be connected to a current measuring unit A via the third sensing line SL3. For example, the current measuring unit A may be an ammeter or a shunt resistor capable of measuring a charging current and a discharging current of the battery 11. The measurement unit 12 may measure the charging current of the battery 11 through the third sensing line SL3 to calculate a charging amount. Further, the measurement unit 12 may measure the discharging current of the battery 11 through the third sensing line SL3 to calculate a discharging amount.

For example, the profile acquisition unit 110 may receive battery information about the voltage and the current of the battery from the measurement unit 12. Then, the profile acquisition unit 110 may generate the battery profile BP and the differential profile based on the battery information.

In another example, the profile acquisition unit 110 may receive the battery profile BP from the measurement unit 12. Then, the profile acquisition unit 110 may generate the differential profile based on the battery profile BP.

In yet another example, the profile acquisition unit 110 may receive the differential profile from the measurement unit 12.

An external device may be connected to the positive electrode terminal P+ and the negative electrode terminal P− of the battery pack 10. For example, the external device may be a charging device or a load. The positive electrode terminal of the battery 11, the positive electrode terminal P+ of the battery pack 10, the external device, the negative electrode terminal P− of the battery pack 10, and the negative electrode terminal of the battery 11 may be electrically connected to each other.

Figure 9:
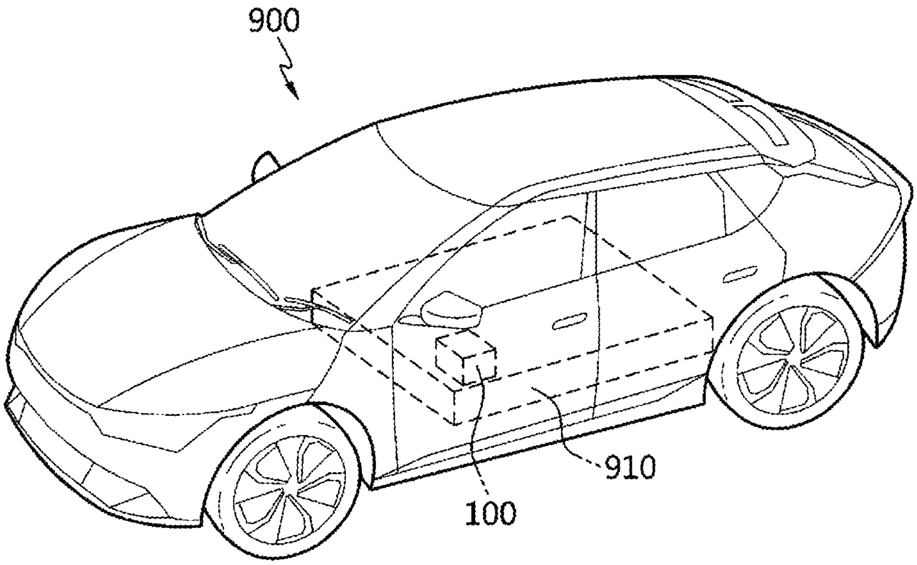
FIG. 9 is a view schematically illustrating a vehicle according to yet another embodiment of the present disclosure.

FIG. 9 is a view schematically illustrating a vehicle according to yet another embodiment of the present disclosure.

Referring to FIG. 9, the battery pack according to an embodiment of the present disclosure may be included in a vehicle 900 such as an electric vehicle (EV) or a hybrid vehicle (HV). A battery pack 910 may supply a power to a motor via an inverter provided in the vehicle 900, to drive the vehicle 900. Here, the battery pack 910 may include the battery information generating apparatus 100. For example, the vehicle 900 may include the battery information generating apparatus 100. In this case, the battery information generating apparatus 100 may be an on-board apparatus included in the vehicle 900.

Figure 10:
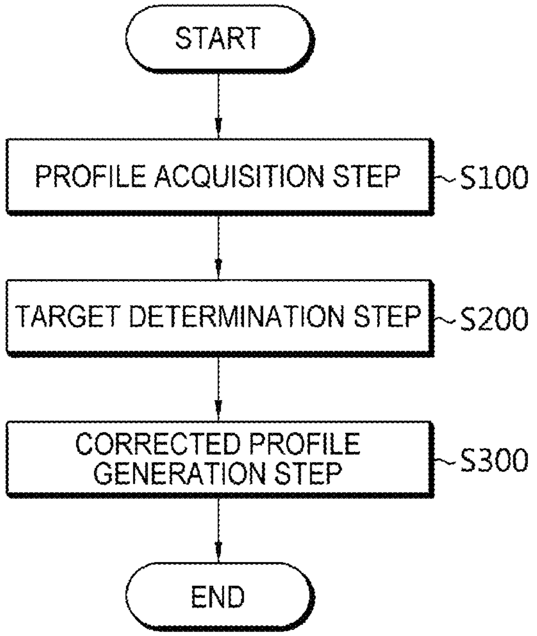
FIG. 10 is a view schematically illustrating a battery information generating method according to still yet another embodiment of the present disclosure.

FIG. 10 is a view schematically illustrating a battery information generating method according to still yet another embodiment of the present disclosure.

Referring to FIG. 10, a battery information generating method may include a profile acquisition step S100, a target determination step S200, and a corrected profile generation step S300.

Each step of the battery information generating method may be performed by the battery information generating apparatus 100.

The profile acquisition step S100 is a step of acquiring the differential profile representing the correspondence between the capacity and the differential voltage of the battery or the correspondence between the voltage and the differential capacity of the battery, and may be performed by the profile acquisition unit 110.

For example, the profile acquisition unit 110 may directly receive the differential profile of the battery from the outside. For example, the profile acquisition unit 110 may acquire the differential profile by being connected to the outside via a wired and/or wireless network to receive the differential profile.

In another example, the profile acquisition unit 110 may directly receive the battery profile BP of the battery from the outside. Then, the profile acquisition unit 110 may generate the differential profile based on the received battery profile BP. The profile acquisition unit 110 may be connected to the outside via a wired and/or wireless network to receive the battery profile BP, and directly generate the differential profile from the received battery profile BP, to acquire the differential profile.

In yet another example, the profile acquisition unit 110 may receive battery information about the voltage and the capacity of the battery. Then, the profile acquisition unit 110 may generate the battery profile BP based on the received battery information, and may generate the differential profile based on the generated battery profile BP. The profile acquisition unit 110 may acquire the differential profile by directly generating the differential profile based on the received battery information.

The target determination step S200 is a step of determining the target C-rate corresponding to the differential profile, and may be performed by the control unit 120.

For example, the control unit 120 may receive the differential profile and information about the C-rate from the profile acquisition unit 110. Then, the control unit 120 may determine the C-rate corresponding to the differential profile to be the target C-rate.

The corrected profile generation step S300 is a step of generating the corrected profile CP by correcting the differential profile based on the overvoltage profile OP corresponding to the target C-rate, and may be performed by the control unit 120.

Then, the control unit 120 may be configured to select an overvoltage profile OP corresponding to the target C-rate from a plurality of pre-stored overvoltage profiles OP. The control unit 120 may be configured to calculate the difference between the differential profile and the overvoltage profile OP to generate the corrected profile CP.

For example, when the differential profile is the first differential profile DP1, the control unit 120 may calculate a differential voltage difference for each capacity between the first differential profile DP1 and the overvoltage profile OP to generate the corrected profile CP.

In another embodiment, when the differential profile is the second differential profile DP2, the control unit 120 may calculate a differential capacity difference for each voltage between the second differential profile DP2 and the overvoltage profile OP to generate the corrected profile CP.

The embodiments of the present disclosure described above are not only implemented by an apparatus and method, but may also be implemented by programs implementing functions corresponding to the components of the embodiments of the present disclosure or a recording medium that stores the programs. This implementation may readily be achieved by one skilled in the art to which the present disclosure belongs, from the descriptions of the embodiments above.

While the present disclosure has been described using limited embodiments and drawings, the present disclosure is not limited thereto, and it may be appreciated that various modifications and changes may be made by those having ordinary skill in the art of the present disclosure within the technical idea of the present disclosure and the equitable scope of the claims set forth below.

Further, since various substitutions, modifications, and changes may be made by those having ordinary skill in the art of the present disclosure within the scope that does not depart from the technical idea of the present disclosure, the present disclosure described above is not limited by the foregoing embodiments and the accompanying drawings, but all or portions of the embodiments may be selectively combined to implement various modifications.

DESCRIPTION OF SYMBOLS

10: battery pack
11: battery
12: measurement unit
100: battery information generating apparatus
110: profile acquisition unit
120: control unit
130: storage unit
900: vehicle
910: battery pack

What is claimed is:

1. A battery information generating apparatus comprising:

a measurement unit coupled to a battery to measure voltage and current of the battery;

a profile acquisition unit configured to acquire a differential profile based on the voltage and the current of the battery measured by the measurement unit, the differential profile representing a correspondence between a capacity and a differential voltage of the battery; and a control unit configured to determine a target C-rate (current rate) corresponding to the differential profile, and correct the differential profile based on an overvoltage profile corresponding to the target C-rate, thereby generating a corrected profile.

2. The battery information generating apparatus according to claim 1, wherein the control unit is configured to calculate a difference between the differential profile and the overvoltage profile to generate the corrected profile.

3. The battery information generating apparatus according to claim 1, wherein the overvoltage profile is pre-stored for each of a plurality of C-rates, and the control unit is configured to select the overvoltage profile corresponding to the target C-rate from a plurality of pre-stored overvoltage profiles.

4. The battery information generating apparatus according to claim 1, wherein the overvoltage profile is preset based on a reference differential profile of a reference battery for a reference C-rate and a target differential profile of the reference battery for the target C-rate.

5. The battery information generating apparatus according to claim 4, wherein the overvoltage profile is preset to represent a difference between the reference differential profile and the target differential profile.

6. The battery information generating apparatus according to claim 4, wherein the target C-rate is set to be greater than the reference C-rate.

7. The battery information generating apparatus according to claim 1, wherein the control unit is configured to output the corrected profile to an outside, to provide information about the battery.

8. An apparatus comprising a battery pack, the battery pack further comprising the battery information generating apparatus according to claim 1.

9. An apparatus comprising a vehicle, the vehicle further comprising the battery information generating apparatus according to claim 1.

10. A battery information generating method comprising:

measuring, using a measurement unit coupled to a battery, voltage and current of the battery;

acquiring a differential profile based on the voltage and the current of the battery measured by the measurement unit, the differential profile representing a correspondence between a capacity and a differential voltage of athe battery;

determining a target C-rate corresponding to the differential profile; and correcting the differential profile based on an overvoltage profile corresponding to the target C-rate to generate a corrected profile.

11. A non-transitory computer-readable storage medium having stored therein a program for performing a battery information generating method, the method comprising:

measuring, using a measurement unit coupled to a battery, voltage and current of the battery;

acquiring a differential profile based on the voltage and the current of the battery measured by the measurement unit, the differential profile representing a correspondence between a capacity and a differential voltage of the battery;

determining a target C-rate corresponding to the differential profile; and correcting the differential profile based on an overvoltage profile corresponding to the target C-rate to generate a corrected profile.

* * * * *